US011239211B2

(12) United States Patent
Han et al.

(10) Patent No.: US 11,239,211 B2
(45) Date of Patent: Feb. 1, 2022

(54) ELECTRONIC DEVICE HAVING A CURVED PORTION BETWEEN A PLURALITY OF CONDUCTIVE PORTIONS ON A SUBSTRATE

(71) Applicant: Industrial Technology Research Institute, Hsinchu (TW)

(72) Inventors: Wei-Kuo Han, Hsinchu (TW); Jing-Yao Chang, New Taipei (TW); Tao-Chih Chang, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 86 days.

(21) Appl. No.: 16/735,707

(22) Filed: Jan. 7, 2020

(65) Prior Publication Data

US 2021/0066257 A1 Mar. 4, 2021

(30) Foreign Application Priority Data

Aug. 28, 2019 (TW) .................................. 108130776

(51) Int. Cl.
*H01L 23/48* (2006.01)
*H01L 21/44* (2006.01)
(Continued)

(52) U.S. Cl.
CPC ...... *H01L 25/072* (2013.01); *H01L 23/49811* (2013.01); *H01L 23/49838* (2013.01);
(Continued)

(58) Field of Classification Search
CPC ......... H01L 24/05; H01L 24/06; H01L 24/29; H01L 24/30; H01L 24/32; H01L 24/33; H01L 24/48; H01L 24/83; H01L 25/072; H01L 23/49838; H01L 23/0753; H01L 23/49811; H01L 23/5283
See application file for complete search history.

(56) References Cited

U.S. PATENT DOCUMENTS 6,313,598 B1 * 11/2001 Tamba .................. H01L 25/165
318/722
6,455,925 B1 9/2002 Laureanti
(Continued)

FOREIGN PATENT DOCUMENTS

CN 104733405 6/2015
CN 107342275 11/2017
(Continued)

*Primary Examiner* — Alonzo Chambliss
(74) *Attorney, Agent, or Firm* — JCIPRNET

(57) ABSTRACT

An electronic device package structure including a substrate, a first circuit layer, a second circuit layer, an electronic device and an input/output device is provided. The first circuit layer includes a first conductive portion, a second conductive portion and a first curve portion located between the first conductive portion and the second conductive portion. At least a partial thickness of the first curve portion is greater than a thickness of the first conductive portion. The electronic device disposed on the second circuit layer is electrically connected to the second conductive portion of the first circuit layer. The input/output device disposed corresponding to the first conductive portion is electrically connected to the first conductive portion of the first circuit layer.

22 Claims, 10 Drawing Sheets

(51) Int. Cl.
   *H05K 7/00*     (2006.01)
   *H01R 9/00*     (2006.01)
   *H01L 25/07*    (2006.01)
   *H01L 23/498*   (2006.01)
   *H01L 23/528*   (2006.01)
   *H01L 23/00*    (2006.01)

(52) U.S. Cl.
   CPC .......... *H01L 23/5283* (2013.01); *H01L 24/05* (2013.01); *H01L 24/06* (2013.01); *H01L 24/29* (2013.01); *H01L 24/30* (2013.01); *H01L 24/32* (2013.01); *H01L 24/33* (2013.01); *H01L 24/48* (2013.01)

(56) References Cited

U.S. PATENT DOCUMENTS

| | | | |
|---|---|---|---|
| 6,525,950 B1* | 2/2003 | Shirakawa | H02M 7/003 307/148 |
| 8,222,749 B2* | 7/2012 | Sato | H05K 1/111 257/784 |
| 8,624,129 B2 | 1/2014 | Monroe | |
| 9,627,361 B2 | 4/2017 | Andrews et al. | |
| 9,641,102 B2* | 5/2017 | Mitamura | H01L 27/0664 |
| 10,049,968 B2* | 8/2018 | Sato | H01L 23/49562 |
| 2003/0146501 A1* | 8/2003 | Sasaki | H01L 25/162 257/692 |
| 2005/0167803 A1* | 8/2005 | Imamura | H05K 1/0281 257/678 |
| 2014/0061885 A1* | 3/2014 | Fernando | H01L 23/49548 257/676 |
| 2014/0131846 A1* | 5/2014 | Shiramizu | H01L 21/4825 257/669 |
| 2014/0192487 A1 | 7/2014 | Mallwitz | |
| 2019/0250041 A1 | 8/2019 | Kangas et al. | |

FOREIGN PATENT DOCUMENTS

| | | |
|---|---|---|
| TW | I446462 | 7/2014 |
| TW | 201933495 | 8/2019 |

* cited by examiner

ELECTRONIC DEVICE HAVING A CURVED PORTION BETWEEN A PLURALITY OF CONDUCTIVE PORTIONS ON A SUBSTRATE

CROSS-REFERENCE TO RELATED APPLICATION

This application claims the priority benefit of Taiwan application serial no. 108130776, filed on Aug. 28, 2019. The entirety of the above-mentioned patent application is hereby incorporated by reference herein and made a part of this specification.

TECHNICAL FIELD

The technical field of the present disclosure relates to an electronic device package structure.

BACKGROUND

In a general power module, a plurality of chips often need to be simultaneously assembled on the same substrate, so that when a line on a circuit layer on the substrate reaches a curve point, local current concentration is liable to occur, which causes a sudden sharp rise of a current density, thereby generating relatively high joule heat to cause the temperature of a chip junction adjacent to the curve point to rise, or to cause the line on the circuit layer to be thermally deformed due to a local high temperature caused by the joule heat.

On another aspect, it is also possible that a plurality of wires, used for connecting the line of the circuit layer with an input/output terminal, of the power module have a non-uniform current density due to the line of the circuit layer, thus generating a high temperature in partial wires. Alternatively, it is also possible that the current density of the various wires is not uniform due to the line of the circuit layer between the power module substrates that connect two chip groups, thus generating a thermal deformation phenomenon caused by the local high temperature.

Most of current power modules use a direct bonded copper (DBC) substrate or a direct plated copper (DPC) substrate as a way for insulation and heat dissipation. A material of ceramic is, for example, alumina ($Al_2O_3$), aluminium nitride (AlN) or silicon nitride ($Si_3N_4$). When the line on the circuit board reaches the curve point, the local current concentration occurs, which causes the sudden sharp rise of the current density, thereby generating the high joule heat, so that a phenomenon that the ceramic (the alumina, the AlN or the $Si_3N_4$) is peeled from the line (copper) of the circuit layer would be also possibly caused.

SUMMARY

An embodiment of the disclosure provides an electronic device package structure, including a substrate, a first circuit layer, a second circuit layer, an electronic device and an input/output device. The first circuit layer is arranged on the substrate. The first circuit layer has a first conductive portion, a second conductive portion and a first curve portion located between the first conductive portion and the second conductive portion. At least a partial thickness of the first curve portion is greater than the thickness of the first conductive portion. The second circuit layer is arranged on the substrate. The electronic device is arranged on the second circuit layer. The electronic device is electrically connected to the second conductive portion of the first circuit layer. The input/output device corresponding to the first conductive portion is arranged on the substrate, and the input/output device is electrically connected to the first conductive portion of the first circuit layer.

In order to make the aforementioned and other objectives and advantages of the present disclosure comprehensible, embodiments accompanied with figures are described in detail below.

DETAILED DESCRIPTION OF DISCLOSED EMBODIMENTS

First embodiment.

Figure 1:
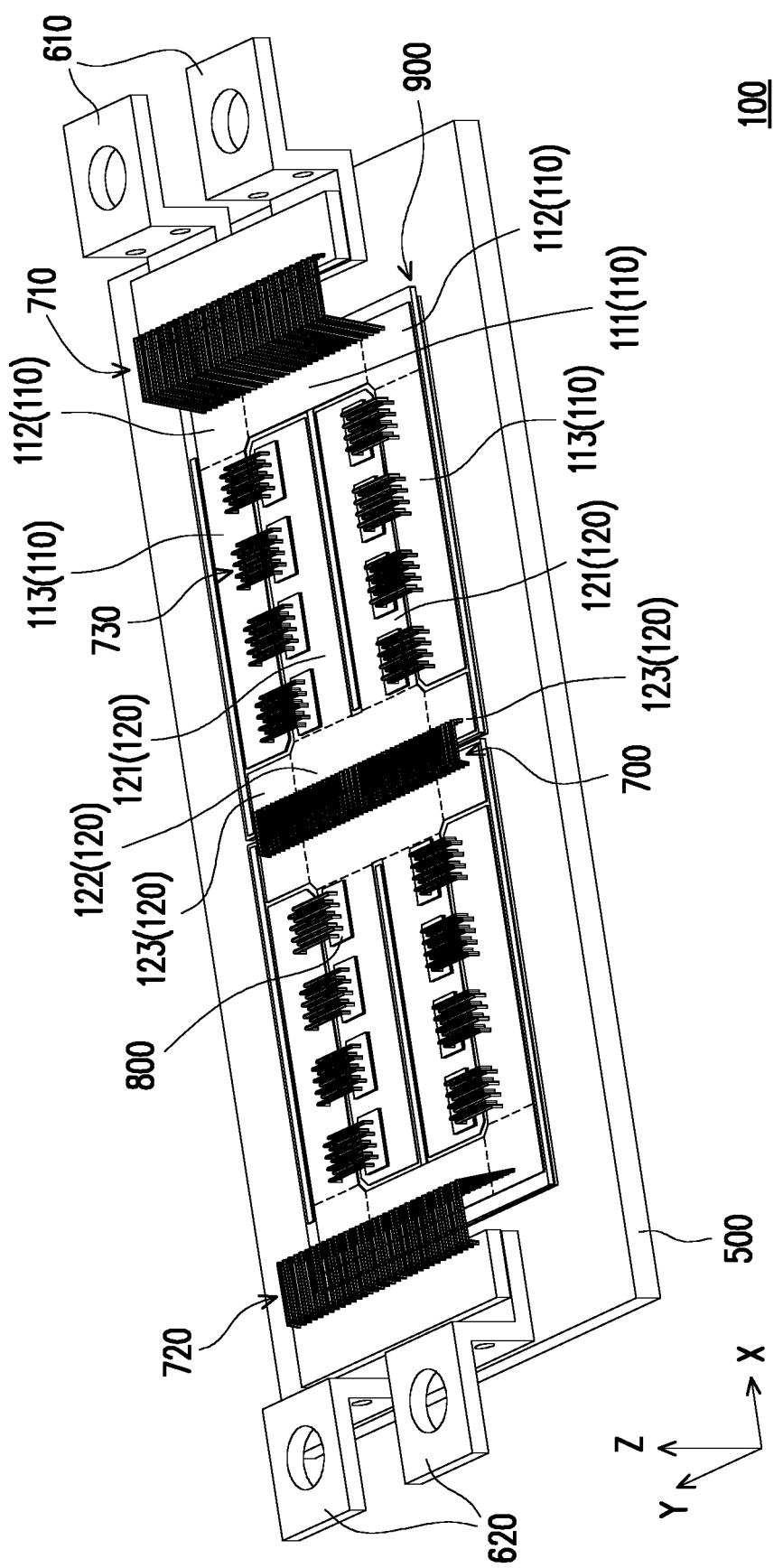
FIG. 1 is a schematic diagram of an electronic device package structure according to a first embodiment of the disclosure.
Figure 2:
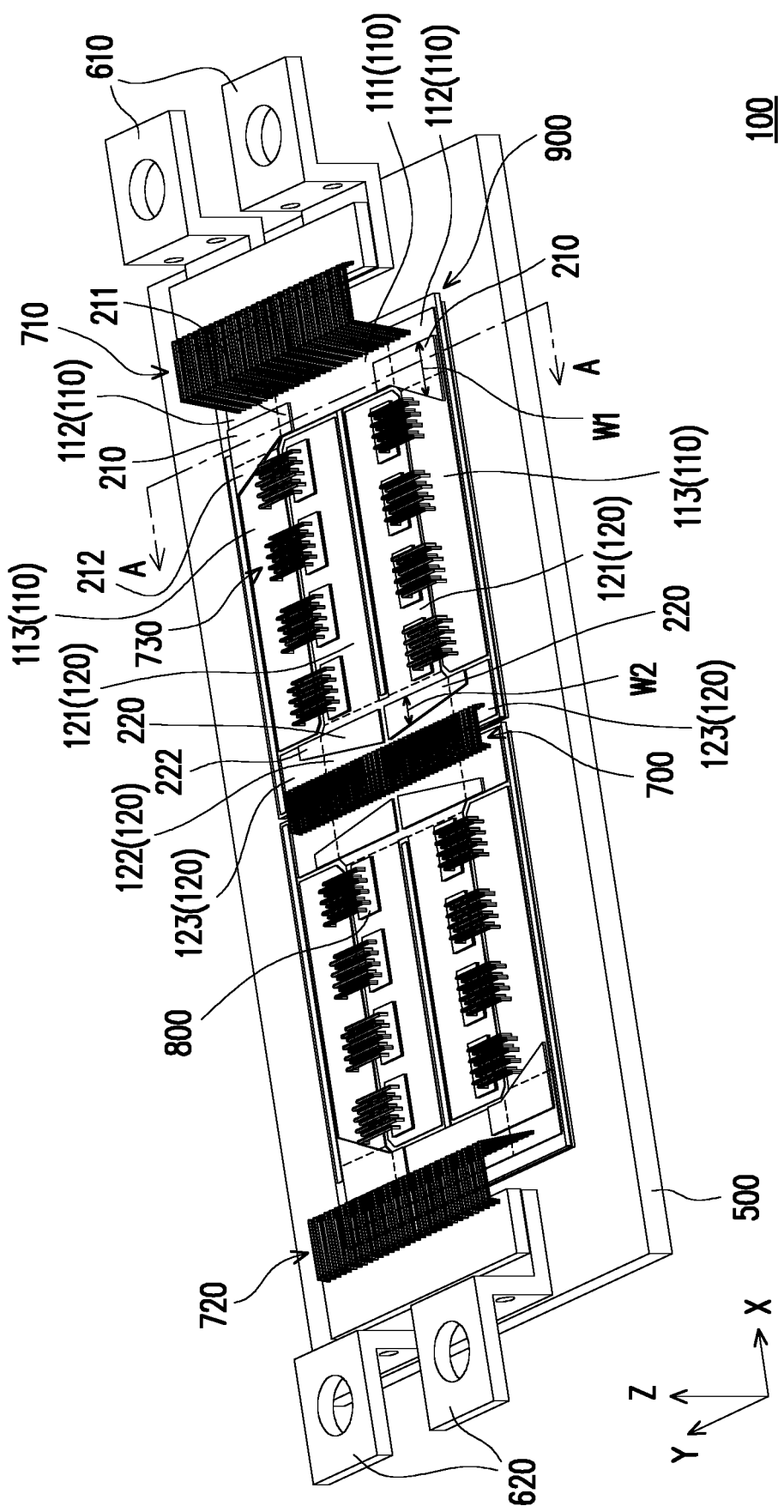
FIG. 2 is a schematic diagram of an electronic device package structure having a thickening layer according to FIG. 1.
Figure 4:
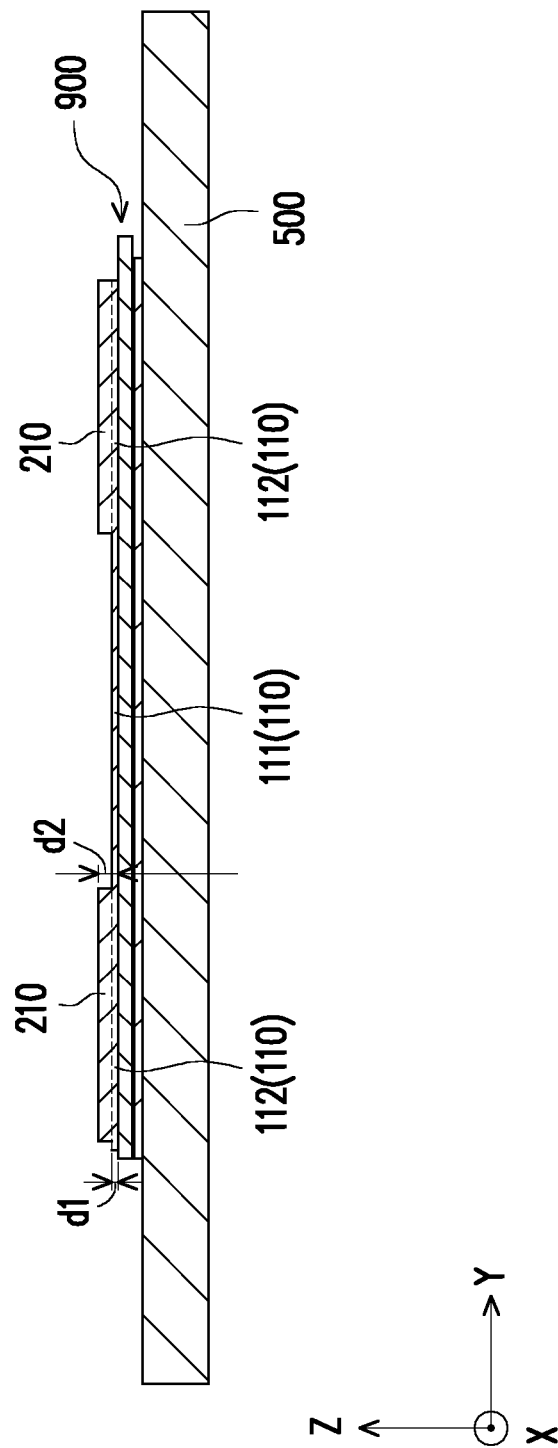
FIG. 4 is a cross-sectional schematic diagram of an electronic device package structure having the thickening layer according to FIG. 2.

FIG. 1 is a schematic diagram of an electronic device package structure according to a first embodiment of the disclosure. FIG. 2 is a schematic diagram of an electronic device package structure having a thickening layer according to FIG. 1. FIG. 4 is a cross-sectional schematic diagram of an electronic device package structure having the thickening layer according to FIG. 1. Referring to FIGS. 1, 2 and 4, the electronic device package structure 100 of the embodiment includes a substrate 900, a first circuit layer 110, a second circuit layer 120, electronic devices 800 and an input/output device 610. The first circuit layer 110 is arranged on the substrate 900. The first circuit layer 110 has a first conductive portion 111, a second conductive portion 113 and a first curve portion 112 located between the first conductive portion 111 and the second conductive portion 113. The first conductive portion 111 is connected to the second conductive portion 113 through the first curve portion 112. The second circuit layer 120 is arranged on the substrate 900. The electronic devices 800 are arranged on the second circuit layer 120 and electrically connected with the second conductive portion 113 of the first circuit layer 110. The input/output device 610 corresponding to the first conductive portion 111 is arranged on the substrate 900, and the input/output device 610 is electrically connected to the first conductive portion 111 of the first circuit layer 110. Since the electronic device package structure 100 is centered by a wire 700 and presents a left-right symmetric design, the following describes the right half from the wire 700 as an example.

Referring to FIGS. 2 and 4 at the same time, FIG. 4 is a cross-sectional schematic diagram of the electronic device package structure having the thickening layer of FIG. 2 along a dotted line A-A. The first curve portion 112 at the upper right side of FIG. 2 is taken as an example. The dotted line A-A is along a Y-axis direction. At least a partial thickness d2 (along a Z-axis direction) of the first curve portion 112 of the first circuit layer 110 is greater than the thickness d1 (along the Z-axis direction) of the first conductive portion 111. The first curve portion 112 at the lower right side of FIG. 2 is taken as an example. The portion of the first curve portion 112 having the thickness greater than that of the first conductive portion 111 has a first thickening layer 210. The width W1 (along an X-axis direction) of the first thickening layer 210 is gradually increased toward a direction (along the negative Y-axis direction) away from the first conductive portion 111.

The electronic device package structure 100 is taken as an example. The first circuit layer 110 is of a U-shaped structure, the second circuit layer 120 is of a T-shaped structure, and the first curve portion 112 is a corner. In one embodiment, a current flows to the first circuit layer 110 through the input/output device 610 via a wire 710, and then flows into a third conductive portion 121 of the second circuit layer 120 through the second conductive portion 113 and wires 730 that are connected to the electronic devices 800. Eight electronic devices 800 that are connected in parallel and two groups of electronic devices 800 that are connected in series are arranged on the substrate 900. The number of the electronic devices 800 is merely illustrative, and the number and configuration positions of the electronic devices 800 may be increased or decreased according to the design requirements. According to the above, when the current flows to the first circuit layer 110 from the input/output device 610 via the wire 710, a phenomenon of a highly concentrated current density is highly likely to occur when the current passes through the first curve portion 112.

The first curve portion 112 at the lower right side of FIG. 2 is taken as an example. When the current flows to the first curve portion 112 from the first conductive portion 111, the first thickening layer 210 may reduce the current density of the first curve portion 112. The width W1 (along the X-axis direction) of the first thickening layer 210 is gradually increased toward the direction (along the negative Y-axis direction) away from the first conductive portion 111, so that the current may be effectively shunted to the end, away from the electronic devices 800, of the first curve portion 112, and the current dispersion may reduce the current density of the third conductive portion 121 below the electronic devices 800 adjacent to the first curve portion 112, the joule heat generated by a high current density and a junction temperature of the electronic devices 800, so as to increase the junction heat dissipation efficiency of the electronic devices 800.

In the embodiment, the first thickening layer 210 extends from the first curve portion 112 to the first conductive portion 111, and the extending portion of the first thickening layer 210 is known as an extending portion 211. The extending portion 211 contributes to shunting the current concentrated at the first curve portion 112 to the first conductive portion 111, which may significantly reduce the phenomenon that the current density of the wire 710 is concentrated on part of the wire.

In the embodiment, the first thickening layer 210 is of a similar trapezoid shape. In other embodiments, the first thickening layer 210 may be of an L shape or other suitable shapes, and the embodiment of the disclosure is not limited thereto.

In some embodiments, the thickness of the first thickening layer 210 is, for example, twice the thickness of the first conductive portion 111. In other embodiments, the thickness of the first thickening layer 210 is, for example, one and a half times of the thickness of the first conductive portion 111. The embodiment of the disclosure does not limit the thickness of the first thickening layer 210, and the thickness may be determined according to the design requirements such as the number of the electronic devices, the current density and lines on the circuit layers.

In some embodiments, the first thickening layer 210 is arranged on a single side (for example, the first thickening layer 210 is merely set at the lower right side of FIG. 2) of the electronic device package structure 100. In some other embodiments, first thickening layers 210 are arranged on both sides (for example, the first thickening layers 210 are simultaneously set at the upper and lower right sides of FIG. 2) of the electronic device package structure 100, as shown in FIG. 2. The embodiment of the disclosure does not limit the number of the first thickening layer 210, and the number may be determined according to the design requirements such as the number of the electronic devices, the current density and the lines on the circuit layers.

Continuously referring to FIG. 2, the second circuit layer 120 of the electronic device package structure 100 includes the third conductive portion 121, a fourth conductive portion 123 and a second curve portion 122 located between the third conductive portion 121 and the fourth conductive portion 123. The third conductive portion 121 is connected with the fourth conductive portion 123 through the second curve portion 122. The electronic devices 800 are arranged on the third conductive portion 121.

According to the above, the current flows to the electronic devices 800 on the second circuit layer 120 through the second conductive portion 113 via the wire 710, and then flows to the fourth conductive portion 123 for dispersion via the third conductive portion 121 and the second curve portion 122 of the second circuit layer 120. When the current flows to the fourth conductive layer 123 from the third conductive portion 121 via the second curve portion 122, the phenomenon of the highly concentrated current density is highly likely to occur when the current passes through the second curve portion 122.

Continuously referring to FIG. 2, at least a partial thickness of the second curve portion 122 of the electronic device package structure 100 is greater than the thickness (along the Z-axis direction) of the third conductive portion 121. The portion of the second curve portion 122 having the thickness greater than that of the third conductive portion 121 has second thickening layers 220, and the widths of the second thickening layers 220 are gradually increased toward a direction away from the fourth conductive portion 123.

Referring to FIG. 2, the second curve portion 122 of the electronic device package structure 100 has upper and lower second thickening layers 220 that are symmetrically arranged. The second thickening layer 220 at the upper side of FIG. 2 is taken as an example. The width of the second thickening layer 220 is gradually increased toward the direction (along the negative Y-axis direction) away from the fourth conductive portion 123. If the second thickening layer 220 at the lower side of FIG. 2 is taken as an example, the width of the second thickening layer 220 is gradually increased toward the direction (along the Y-axis direction) away from the fourth conductive portion 123.

The second thickening layer 220 at the upper side of FIG. 2 is taken as an example. When the current flows to the second curve portion 122 from the third conductive portion 121 of the second circuit layer 120, since the second curve portion 122 has the second thickening layer 220, the current density at a curve point may be significantly reduced, and then the junction temperature of the electronic devices 800 adjacent to the second curve portion 122 is improved, and the junction heat dissipation efficiency of the electronic devices 800 is increased.

In some embodiments, the second thickening layer 220 at the lower side of FIG. 2 is taken as an example. The width W2 (along the X-axis direction) of the second thickening layer 220 is gradually increased toward the direction (along the Y-axis direction) away from the fourth conductive portion 123, so that the current may be effectively shunted to the end, away from the electronic devices 800, of the second curve portion 122, and the current dispersion may reduce the current density of the third conductive portion 121 below the electronic devices 800 adjacent to the second curve portion 122, the joule heat generated by the high current density and the junction temperature of the electronic devices 800.

In the embodiment, the second thickening layer 220 extends from the second curve portion 122 to the fourth conductive portion 123, and the extending portion of the second thickening layer 220 is known as an extending portion 222. The extending portion 222 contributes to shunting the current concentrated at the second curve portion 122 to the fourth conductive portion 123, which may significantly reduce the current density of the third conductive portion 121 below the electronic devices 800 of the second curve portion 122, the joule heat generated by the high current density and the junction temperature of the electronic devices 800.

In the embodiment, the second thickening layer 220 is of a trapezoid shape. In other embodiments, the second thickening layer 220 may be of an L shape or other suitable shapes, and the embodiment of the disclosure is not limited thereto.

In some embodiments, the thickness of the second thickening layer 220 is, for example, twice the thickness of the third conductive portion 121. In other embodiments, the thickness of the second thickening layer 220 is, for example, one and a half times of the thickness of the third conductive portion 121. The embodiment of the disclosure does not limit the thickness of the second thickening layer 220, and the thickness may be determined according to the design requirements such as the number of the electronic devices, the current density and lines on the circuit layers.

In some embodiments, the second thickening layer 220 is arranged on a single side (for example, the second thickening layer 220 is merely set on the lower right side of the wire 700 of FIG. 2) of the electronic device package structure 100. In some other embodiments, second thickening layers 220 are arranged on both sides (for example, the second thickening layers 220 are simultaneously set at the upper and lower right sides of the wire 700 of FIG. 2) of the electronic device package structure 100, as shown in FIG. 2. The embodiment of the disclosure does not limit the number of the second thickening layer 220, and the number may be determined according to the design requirements such as the number of the electronic devices, the current density and the lines on the circuit layers.

Figure 3:
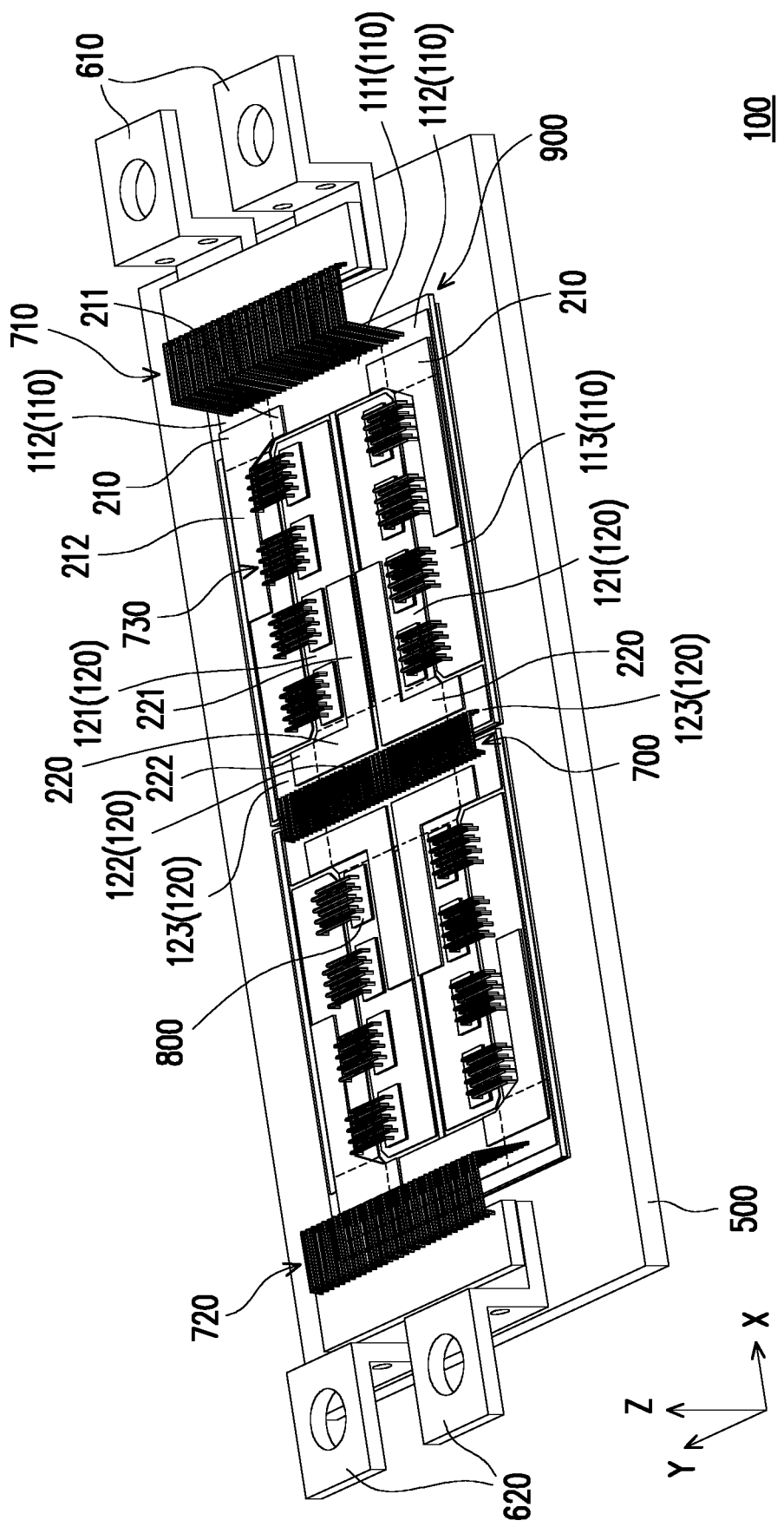
FIG. 3 is a schematic diagram of a circuit layer of the electronic device package structure having the thickening layer according to FIG. 1.

FIG. 3 is a schematic diagram of an electronic device package structure having a thickening layer according to FIG. 1. The electronic device package structure of FIG. 3 is similar to the electronic device package structure of FIG. 2, so descriptions of components that have been described in FIGS. 1 and 2 are omitted herein. A difference between the electronic device package structure 100 of the embodiment and the electronic device package structure 100 of FIG. 2 is, for example, the shapes of a first thickening layer 210 and a second thickening layer 220.

In the embodiment, at least a partial thickness (along the Z-axis direction) of the second curve portion 122 is greater than the thickness (along the Z-axis direction) of the third conductive portion 121. The portion of the second curve portion 122 having the thickness greater than that of the third conductive portion 121 has a second thickening layer 220. The second thickening layer 220 extends from the second curve portion 122 to the third conductive portion 121, and the extending portion of the second thickening layer 220 is known as an extending portion 221. The second thickening layer 220 extends from the second curve portion 122 to the fourth conductive portion 123, and the extending portion of the second thickening layer 220 is known as an extending portion 222. In some embodiments, the width of the second thickening layer 220 is kept unchanged. Keeping the width (along the Y-axis direction) of the second thickening layer 220 unchanged means that, for example, the width of the extending portion 221 from the second curve portion 122 toward the third conductive portion 121 (along the X-axis direction) is kept unchanged, or the width of the extending portion 222 from the second curve portion 122 toward the fourth conductive portion 123 (along the Y-axis direction) is kept unchanged.

The first thickening layer 210 extends from the first curve portion 112 to the second conductive portion 113, and the extending portion of the first thickening layer 210 is known as an extending portion 212. The extending portion 211 contributes to shunting the current concentrated at the first curve portion 112 to the first conductive portion 111, and the extending portion 212 contributes to shunting the current concentrated at the first curve portion 112 to the second conductive portion 113. The current dispersion may significantly reduce the current density of the third conductive portion 121 below the electronic devices 800 adjacent to the first curve portion 112, the joule heat generated by the high current density and the junction temperature of the electronic devices 800.

According to the above, the second thickening layer 220 may uniformly guide the current that flows out of the electronic devices 800 toward the wire 700 to the second curve portion 122 and the fourth conductive portion 123. The current dispersion may significantly reduce the current density of the third conductive portion 121 below the electronic devices 800 adjacent to the second curve portion 122, the joule heat generated by the high current density and the junction temperature of the electronic devices 800, so as to increase the heat dissipation efficiency of the electronic device package structure 100.

In some embodiments, the thickness of the second thickening layer 220 is, for example, twice the thickness of the third conductive portion 121. In other embodiments, the thickness of the second thickening layer 220 is, for example, one and a half times of the thickness of the third conductive portion 121. The embodiment of the disclosure does not limit the thickness of the second thickening layer 220, and the thickness may be determined according to the design requirements such as the number of the electronic devices, the current density and lines on the circuit layers.

In some embodiments, the second thickening layer 220 is arranged on a single side (for example, the second thickening layer 220 is merely set on the lower right side of the wire 700 of FIG. 2) of the electronic device package structure 100. In some other embodiments, second thickening layers 220 are arranged on both sides (for example, the second thickening layers 220 are simultaneously set at the upper and lower right sides of the wire 700 of FIG. 2) of the electronic device package structure 100, as shown in FIG. 2. The embodiment of the disclosure does not limit the number of the second thickening layer 220, and the number may be determined according to the design requirements such as the number of the electronic devices, the current density and the lines on the circuit layers. In the first embodiment, the first thickening layer 210 may further extend below the wire 710, and the second thickening layer 220 may further extend below the wire 700, which may be determined according to the design requirements.

In some embodiments, the substrate 900 may be a direct bonded copper (DBC) substrate, a direct plated copper (DPC) substrate, or an insulated metal substrate (IMS). A material of ceramic is, for example, alumina ($Al_2O_3$), aluminium nitride (AlN) or silicon nitride ($Si_3N_4$). In the first embodiment, referring to FIG. 4, the substrate 900 is, for example, the DPC substrate, and the first thickening layer 210 and the first circuit layer 110 may be DPC upper copper. The next layer of the DPC upper copper may be a ceramic layer, and the next layer of the ceramic layer may be DPC lower copper. The next layer of the DPC lower copper is, for example, a solder. The DPC lower copper is connected with a substrate 500 through the solder. In some other embodiments, the substrate 900 may be a flexible substrate, such as a thin glass substrate, a thin metal substrate or a plastic substrate.

In some embodiments, the electronic device 800 may be a power chip, such as an insulated-gate bipolar transistor (IGBT), a metal-oxide semiconductor field effect transistor (MOSFET) or a diode, and the disclosure is not limited thereto.

Second Embodiment

Figure 5:
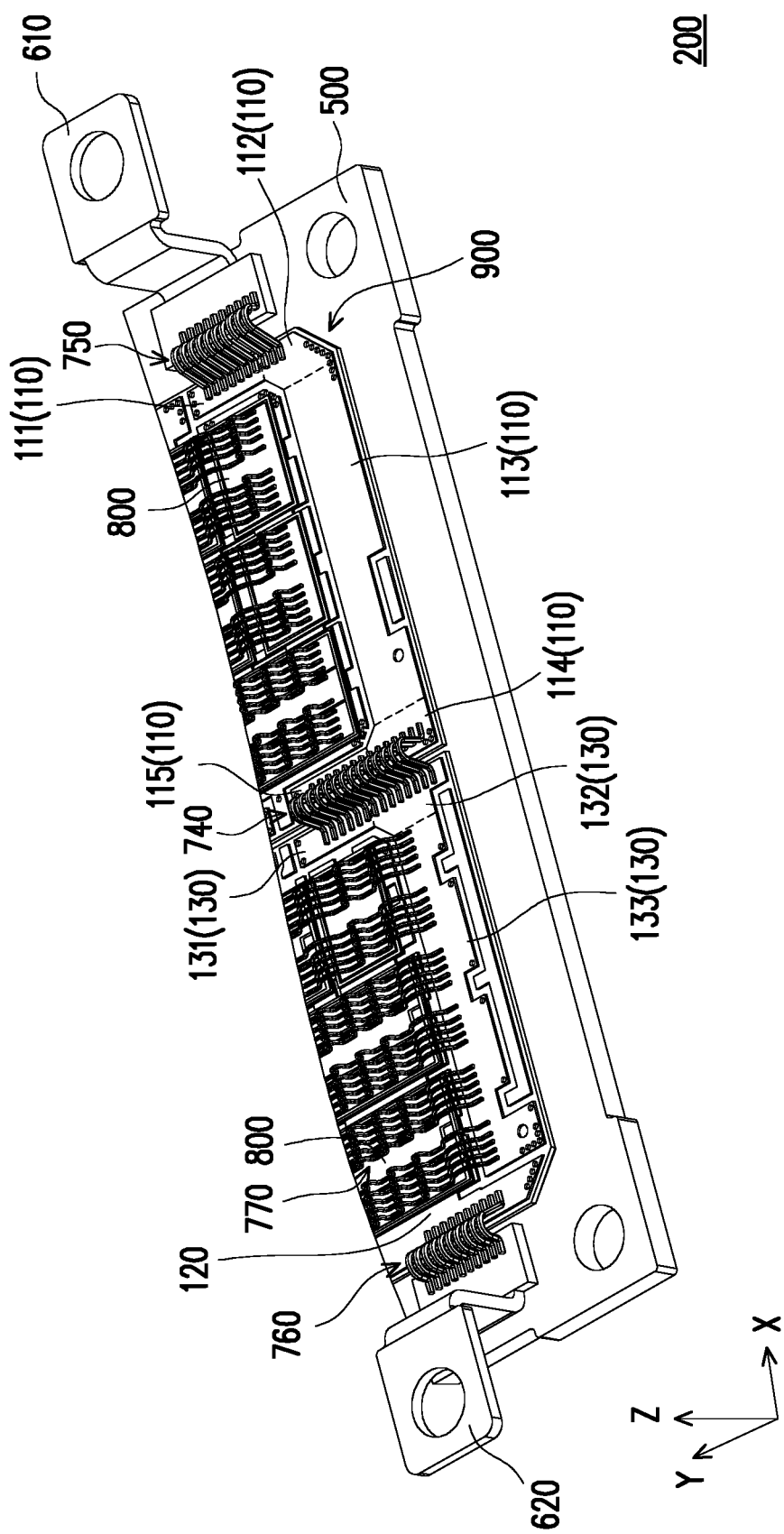
FIG. 5 is a cross-sectional schematic diagram of an electronic device package structure according to a second embodiment of the disclosure.
Figure 6:
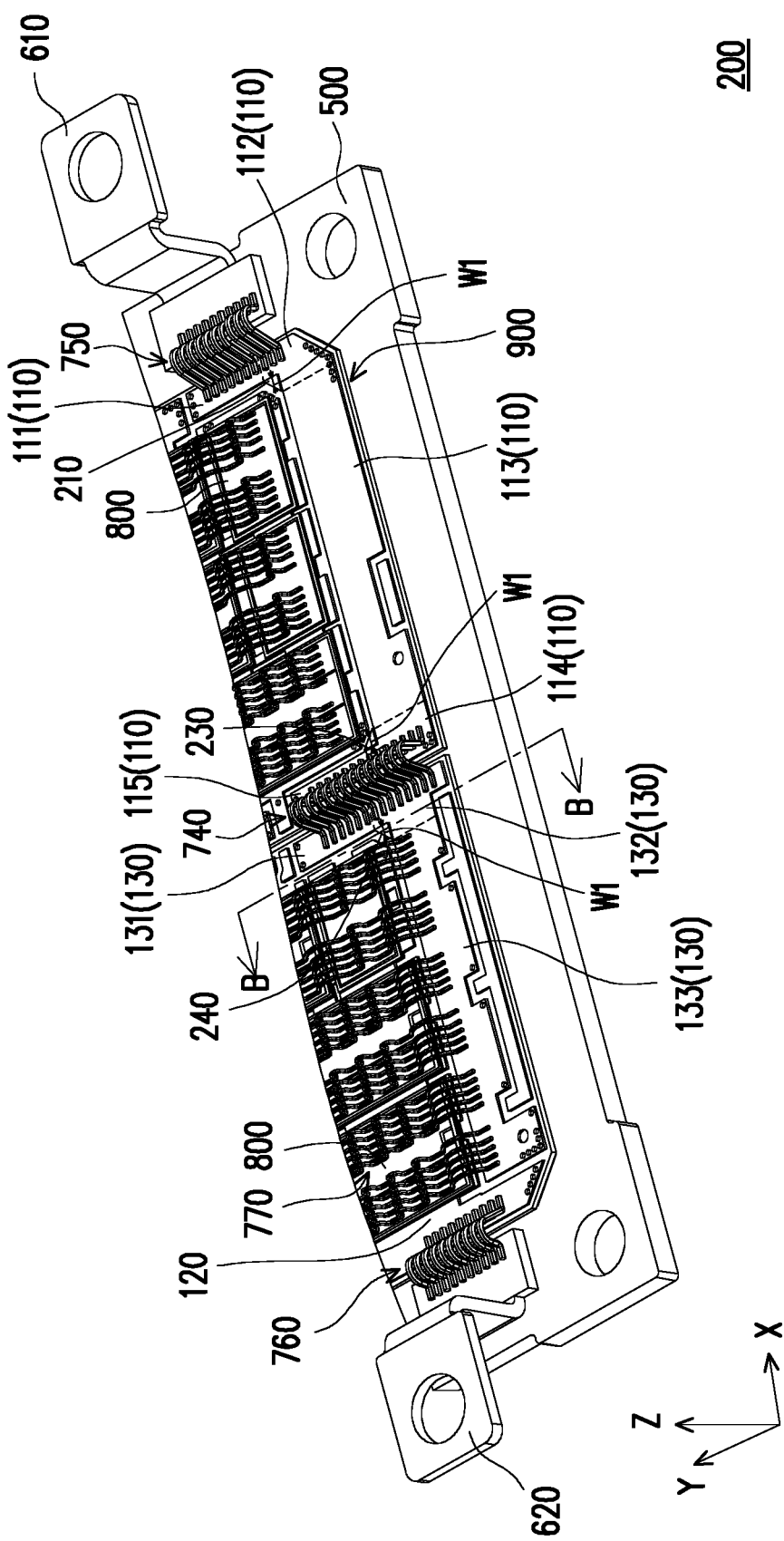
FIG. 6 is a schematic diagram of an electronic device package structure having a thickening layer according to FIG. 5.
Figure 9:
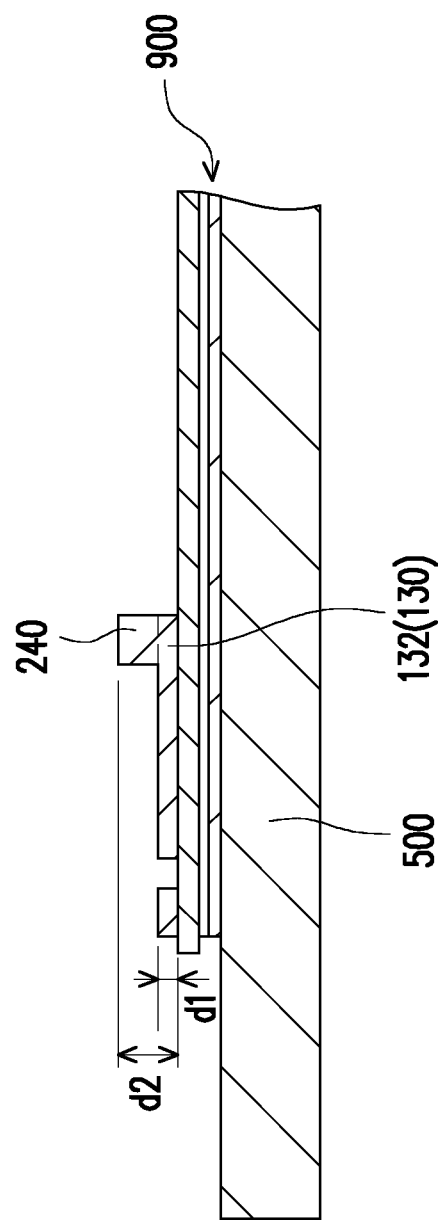
FIG. 9 is a cross-sectional schematic diagram of an electronic device package structure having the thickening layer according to FIG. 6.

FIG. 5 is a cross-sectional schematic diagram of an electronic device package structure according to a second embodiment of the disclosure. FIG. 6 is a schematic diagram of an electronic device package structure having a thickening layer according to FIG. 5. FIG. 9 is a cross-sectional schematic diagram of an electronic device package structure having the thickening layer according to FIG. 6.

Referring to FIGS. 5, 6 and 9, the electronic device package structure 200 of the embodiment includes a substrate 900, a first circuit layer 110, a second circuit layer 120, electronic devices 800 and an input/output device 610. The first circuit layer 110 is arranged on the substrate 900. The first circuit layer 110 has a first conductive portion 111, a second conductive portion 113 and a first curve portion 112 located between the first conductive portion 111 and the second conductive portion 113. The first conductive portion 111 is connected to the second conductive portion 113 through the first curve portion 112. The second circuit layer 120 is arranged on the substrate 900. The electronic devices 800 are arranged on the second circuit layer 120 and electrically connected with the second conductive portion 113 of the first circuit layer 110. The input/output device 610 corresponding to the first conductive portion 111 is arranged on the substrate 900, and the input/output device 610 is electrically connected to the first conductive portion 111 of the first circuit layer 110. In the embodiment, the first curve portion 112 is a corner.

Referring to FIG. 6, a portion of the first curve portion 112 having the thickness greater than that of the first conductive portion 111 has a first thickening layer 210. The width W1 (along an X-axis direction) of the first thickening layer 210 is gradually increased toward a direction (along the negative Y-axis direction) away from the first conductive portion 111.

The first circuit layer 110 also includes a fifth conductive portion 115 and a third curve portion 114. The third curve portion 114 is located between the second conductive portion 113 and the fifth conductive portion 115, and the second conductive portion 113 is connected with the fifth conductive portion 115 through the third curve portion 114. At least a partial thickness of the third curve portion 114 is greater than the thickness of the second conductive portion 113. The portion of the third curve portion 114 having the thickness greater than that of the second conductive portion 113 has a third thickening layer 230, and the width W1 (along an X-axis direction) of the third thickening layer 230 is gradually increased toward a direction (along a negative Y-axis direction) away from the second conductive portion 113.

The electronic device package structure 200 of the embodiment also includes a third circuit layer 130, arranged between the first circuit layer 110 and the second circuit layer 120. The first circuit layer 110 is electrically connected to the third circuit layer 130 through a wire 740, and the third circuit layer 130 is electrically connected to the electronic devices 800 through a wire 770.

The third circuit layer of the electronic device package structure 200 of the embodiment also includes a sixth conductive portion 131, a seventh conductive portion 133 and a fourth curve portion 132 located between the sixth conductive portion 131 and the seventh conductive portion 133. The sixth conductive portion 131 is connected with the seventh conductive portion 133 through the fourth curve portion 132. At least a partial thickness of the fourth curve portion 132 is greater than the thickness of the sixth conductive portion 131.

Referring to FIGS. 6 and 9 at the same time, FIG. 9 is a cross-sectional schematic diagram of the electronic device package structure having the thickening layer of FIG. 6 along a dotted line B-B. The fourth curve portion 132 of FIG. 6 is taken as an example. The dotted line B-B is along a Y-axis direction. At least a partial thickness d2 (along a Z-axis direction) of the fourth curve portion 132 of the third circuit layer 130 is greater than the thickness d1 (along the Z-axis direction) of the sixth conductive portion 131. The fourth curve portion 132 of FIG. 6 is taken as an example. The portion of the fourth curve portion 132 having the thickness greater than that of the sixth conductive portion 131 has a fourth thickening layer 240. The width W1 (along an X-axis direction) of the fourth thickening layer 240 is gradually increased toward a direction (along the negative Y-axis direction) away from the sixth conductive portion 131.

In one embodiment, a current (the flowing direction of which is determined according to the characteristics of the electronic devices) flows to the first conductive portion 111 and the first curve portion 112 of the first circuit layer 110 through the input/output device 610 via a wire 750, then flows through the second conductive portion 113, the third curve portion 114 and the fifth conductive portion 115 of the first circuit layer 110 and the wire 740, and enters the sixth conductive portion 131 and the fourth curve portion 132 of the third circuit layer 130. The current then enters the electronic devices 800 via the seventh conductive portion 133 of the third circuit layer 130 and the wire 770, and flows out from an input/output device 620 through the second circuit layer 120.

When the current flows to the first conductive portion 111 and the first curve portion 112 of the first circuit layer 110 from the wire 750, a phenomenon of a highly concentrated current density is highly likely to occur. The first thickening layer 210 may reduce the current density of the first curve portion 112. The width W1 (along the X-axis direction) of the first thickening layer 210 is gradually increased toward the direction (along the negative Y-axis direction) away from the first conductive portion 111, which may effectively shunt the current to the first curve portion 112. The current dispersion then improves the phenomenon that the current density is concentrated on part of the wire 750 adjacent to the first curve portion 112 and a phenomenon of an extremely high temperature of the part of the wire 750 caused by extremely high joule heat due to the high current density.

When the current flows from the second conductive portion 113 of the first circuit layer 110 to the third curve portion 114 and the fifth conductive portion 115, the phenomenon of a highly concentrated current density is also likely to occur at the third curve portion 114. The portion of the third curve portion 114 having the thickness greater than the thickness of the second conductive portion 113 has a third thickening layer 230. The width W1 (along the X-axis direction) of the third thickening layer 230 is gradually increased toward the direction (along the negative Y-axis direction) away from the second conductive portion 113, which may effectively shunt the current to the third curve portion 114 for current dispersion, and then improve the phenomenon that the current density is concentrated on part of the wire 740 adjacent to the third curve portion 114 and a phenomenon of an extremely high temperature of the part of the wire 740 caused by extremely high joule heat due to the high current density.

When the current enters the sixth conductive portion 131 and the fourth curve portion 132 of the third circuit layer 130 through the wire 740, the phenomenon of a highly concentrated current density is also likely to occur. When the width W1 (along the X-axis direction) of the fourth thickening layer 240 is gradually increased toward the direction (along the negative Y-axis direction) away from the sixth conductive portion 131, the current may be effectively shunted to the fourth curve portion 132. The current dispersion then improves the phenomenon that the current density is concentrated on part of the wire 740 adjacent to the fourth curve portion 132 and a phenomenon of an extremely high temperature of the part of the wire caused by extremely high joule heat due to the high current density.

In the embodiment, the first thickening layer 210, the second thickening layer 220 and the third thickening layer 230 are triangular. In other embodiments, the first thickening layer 210, the second thickening layer 220 and the third thickening layer 230 may be of an L shape or other suitable shapes, and the embodiment of the disclosure is not limited thereto.

In some embodiments, the thickness of the first thickening layer 210 is, for example, twice the thickness of the first conductive portion 111; the thickness of the third thickening layer 230 is, for example, twice the thickness of the second conductive portion 113; and thickness of the fourth thickening layer 240 is, for example, twice the thickness of the sixth conductive portion 131. In other embodiments, the thickness of the first thickening layer 210 is, for example, one and a half times of the thickness of the first conductive portion 111; the thickness of the third thickening layer 230 is, for example, one and a half times of the thickness of the second conductive portion 113; and thickness of the fourth thickening layer 240 is, for example, one and a half times of the thickness of the sixth conductive portion 131. The embodiment of the disclosure does not limit the thicknesses of the first thickening layer 210, the third thickening layer 230 and the fourth thickening layer 240, and the thicknesses may be determined according to the design requirements such as the number of electronic devices, the current density and lines on the circuit layers.

Figure 7:
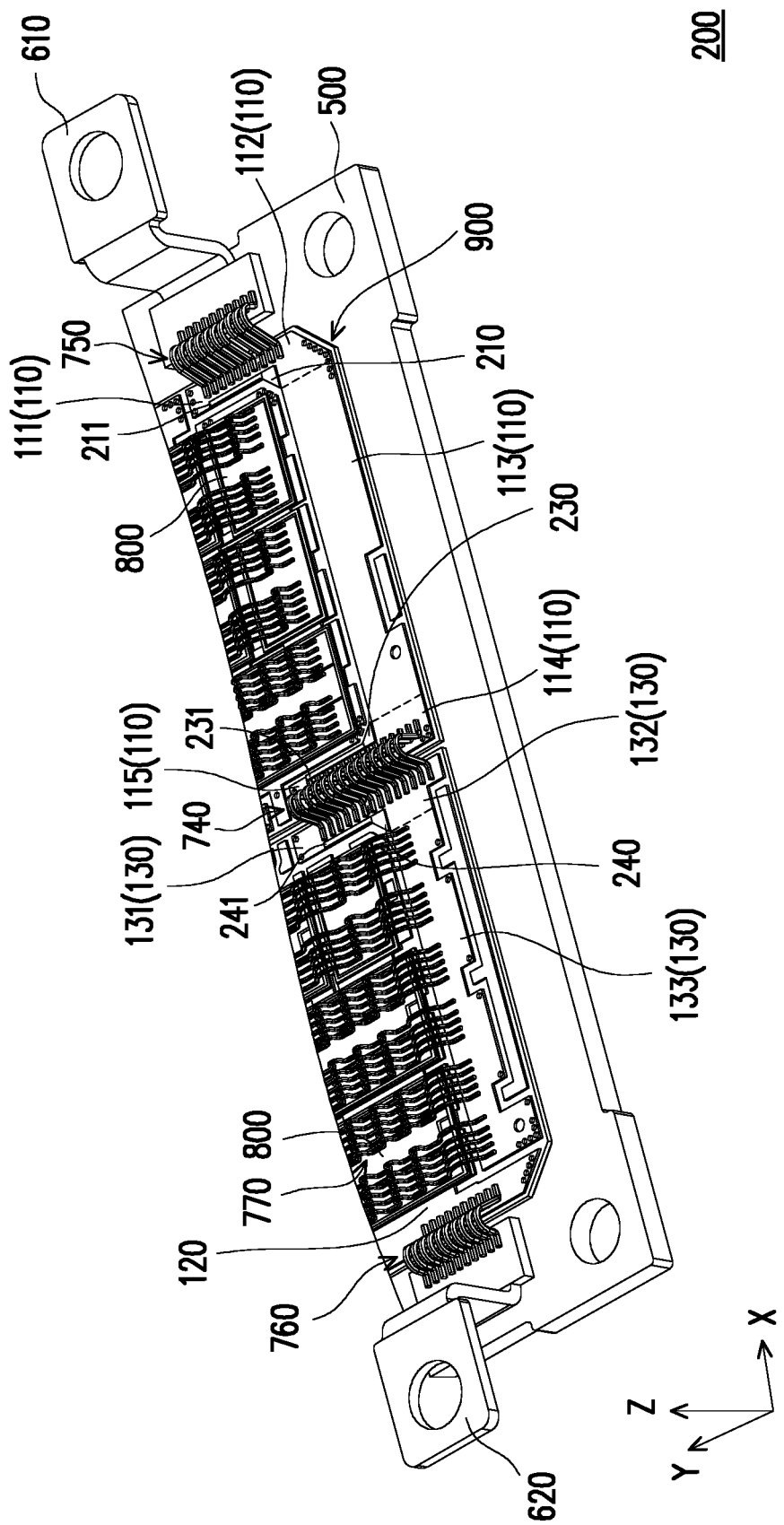
FIG. 7 is a schematic diagram of an electronic device package structure having a thickening layer according to FIG. 5.

FIG. 7 is a schematic diagram of an electronic device package structure having a thickening layer according to FIG. 5. The electronic device package structure of FIG. 7 is similar to the electronic device package structure of FIG. 6, and same or similar numerals refer to same or similar components, so descriptions of components that have been described in FIGS. 5 and 6 are omitted herein. A difference between the electronic device package structure 200 of the embodiment and the electronic device package structure 200 of FIG. 6 is, for example, the shapes of a first thickening layer 210, a third thickening layer 230 and a fourth thickening layer 240.

In the embodiment, the first thickening layer 210, the third thickening layer 230 and the fourth thickening layer 240 are of an L shape. The first thickening layer 210 extends from the first curve portion 112 to the first conductive portion 111, and the extending portion of the first thickening layer 210 is known as an extending portion 211. The extending portion 211 contributes to shunting the current concentrated at the first curve portion 112 to the first conductive portion 111, which may significantly reduce the current density, and then improve the phenomenon that the current density is concentrated on part of the wire 750 adjacent to the first curve portion 112 and a phenomenon of an extremely high temperature of the part of the wire 750 caused by extremely high joule heat due to the high current density.

In the embodiment, the third thickening layer 230 extends from the third curve portion 114 to the fifth conductive portion 115, and the extending portion of the third thickening layer 230 is known as an extending portion 231. The extending portion 231 contributes to shunting the current concentrated at the third curve portion 114 to the fifth conductive portion 115, and the current dispersion may improve the phenomenon that the current density is concentrated on part of the wire 740 adjacent to the third curve portion 114 and a phenomenon of an extremely high temperature of the part of the wire 740 caused by extremely high joule heat due to the high current density.

In the embodiment, the fourth thickening layer 240 extends from the fourth curve portion 132 to the sixth conductive portion 131, and the extending portion of the fourth thickening layer 240 is known as an extending portion 241. The extending portion 241 contributes to shunting the current concentrated at the fourth curve portion 132 to the sixth conductive portion 131, and the current dispersion may improve the phenomenon that the current density is concentrated on part of the wire 740 adjacent to the fourth curve portion 132 and a phenomenon of an extremely high temperature of the part of the wire caused by extremely high joule heat due to the high current density.

In some embodiments, the thickness of the first thickening layer 210 is, for example, twice the thickness of the first conductive portion 111; the thickness of the third thickening layer 230 is, for example, twice the thickness of the second conductive portion 113; and thickness of the fourth thickening layer 240 is, for example, twice the thickness of the sixth conductive portion 131. In other embodiments, the thickness of the first thickening layer 210 is, for example, one and a half times of the thickness of the first conductive portion 111; the thickness of the third thickening layer 230 is, for example, one and a half times of the thickness of the second conductive portion 113; and thickness of the fourth thickening layer 240 is, for example, one and a half times of the thickness of the sixth conductive portion 131. The embodiment of the disclosure does not limit the thicknesses of the first thickening layer 210, the third thickening layer 230 and the fourth thickening layer 240, and the thicknesses may be determined according to the design requirements such as the number of electronic devices, the current density and lines on the circuit layers.

Figure 8:
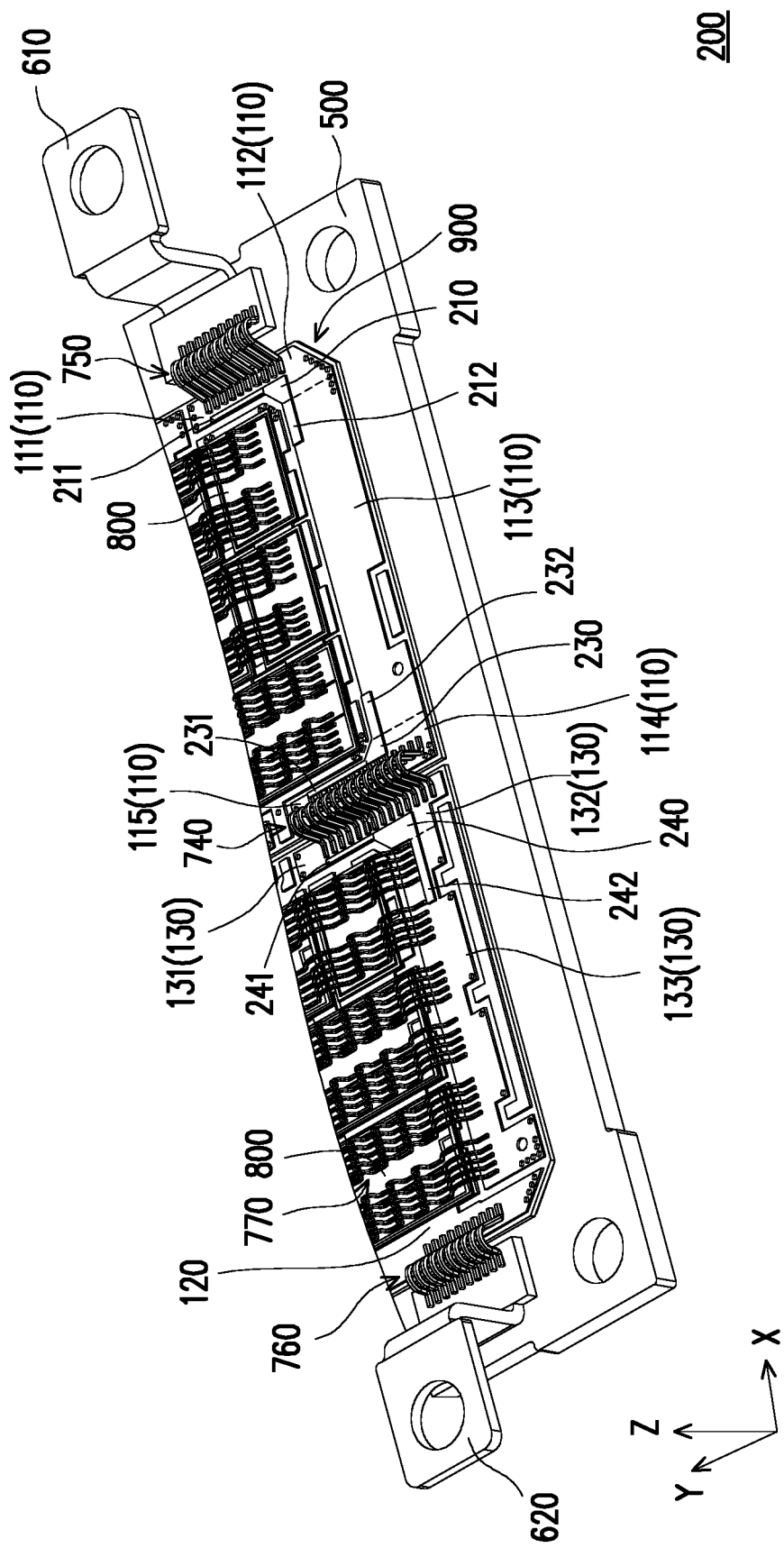
FIG. 8 is a schematic diagram of an electronic device package structure having a thickening layer according to FIG. 5.

FIG. 8 is a schematic diagram of an electronic device package structure having a thickening layer according to FIG. 5. The electronic device package structure of FIG. 8 is similar to the electronic device package structure of FIG. 6, and same or similar numerals refer to same or similar components, so descriptions of components that have been described in FIGS. 5 and 6 are omitted herein. A difference between the electronic device package structure 200 of the embodiment and the electronic device package structure 200 of FIG. 7 is, for example, the shapes of a first thickening layer 210, a third thickening layer 230 and a fourth thickening layer 240.

In the embodiment, the first thickening layer 210, the third thickening layer 230 and the fourth thickening layer 240 are of an L shape. The first thickening layer 210 extends from the first curve portion 112 to the first conductive portion 111, and the extending portion of the first thickening layer 210 is known as an extending portion 211. The first thickening layer 210 extends from the first curve portion 112 to the second conductive portion 113, and the extending portion of the first thickening layer 210 is known as an extending portion 212. The extending portion 211 and the extending portion 212 contribute to shunting the current concentrated at the first curve portion 112 to the first conductive portion 111 and the second conductive portion 113 respectively, and the current dispersion may improve the phenomenon that the current density is concentrated on part of the wire 750 adjacent to the first curve portion 112 and a phenomenon of an extremely high temperature of the part of the wire caused by extremely high joule heat due to the high current density.

In the embodiment, the third thickening layer 230 extends from the third curve portion 114 to the second conductive portion 113, and the extending portion of the third thickening layer 230 is known as an extending portion 232. The third thickening layer 230 extends from the third curve portion 114 to the fifth conductive portion 115, and the extending portion of the third thickening layer 230 is known as an extending portion 241. The extending portion 232 and the extending portion 241 contribute to shunting the current concentrated at the third curve portion 114 to the second conductive portion 113 and the fifth conductive portion 115 respectively, and the current dispersion may improve the phenomenon that the current density is concentrated on part of the wire 740 adjacent to the third curve portion 114 and a phenomenon of an extremely high temperature of the part of the wire caused by extremely high joule heat due to the high current density.

In the embodiment, the fourth thickening layer 240 extends from the fourth curve portion 132 to the sixth conductive portion 131, and the extending portion of the fourth thickening layer 240 is known as an extending portion 241. The fourth thickening layer 240 extends from the fourth curve portion 132 to the seventh conductive portion 133, and the extending portion of the fourth thickening layer 240 is known as an extending portion 242. The extending portion 241 and the extending portion 242 contribute to shunting the current concentrated at the fourth curve portion 132 to the sixth conductive portion 131 and the seventh conductive portion 133 respectively, and the current dispersion may improve the phenomenon that the current density is concentrated on part of the wire 740 adjacent to the fourth curve portion 132 and a phenomenon of an extremely high temperature of the part of the wire caused by extremely high joule heat due to the high current density.

In some embodiments, the substrate 900 may be a direct bonded copper (DBC) substrate, a direct plated copper (DPC) substrate, or an insulated metal substrate (IMS). A material of ceramic is, for example, alumina ($Al_2O_3$), aluminium nitride (AlN) or silicon nitride ($Si_3N_4$). In the second embodiment, referring to FIG. 9, FIG. 9 is a cross-sectional schematic diagram of an electronic device package structure having the thickening layer according to FIG. 6. The substrate 900 is, for example, the DPC substrate, and the fourth thickening layer 240 and the third circuit layer 130 may be DPC upper copper. The next layer of the DPC upper copper may be a ceramic layer, and the next layer of the ceramic layer may be DPC lower copper. The next layer of the DPC lower copper is, for example, a solder. The DPC lower copper is connected with a substrate 500 through the solder. In some other embodiments, the substrate 900 may be a flexible substrate, such as a thin glass substrate, a thin metal substrate or a plastic substrate. In the second embodiment, the first thickening layer 210 may further extend below the wire 750, and the third thickening layer 230 may further extend below the wire 740, which may be determined according to the design requirements.

Figure 10:
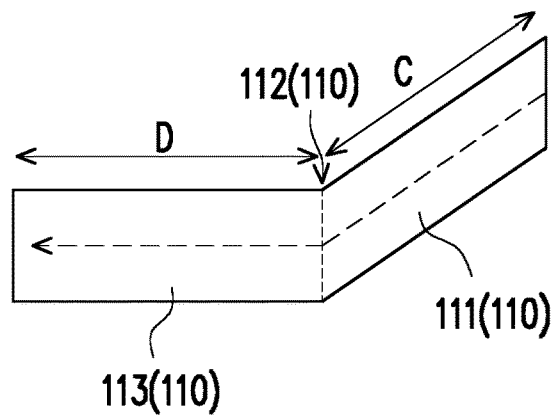
FIG. 10 is a partially planar schematic diagram of an electronic device package structure according to another embodiment of the disclosure.

FIG. 10 is a partially planar schematic diagram of an electronic device package structure according to another embodiment of the disclosure. In the embodiment, a first curve portion 112 is a corner, that is, an extending direction C of a first conductive portion 111 and an extending direction D of a second conductive portion 113 are different. When a current flows, for example, from the first conductive portion 111 of the first circuit layer 110 to the second conductive portion 113 (as the dotted arrow direction of FIG. 10), a phenomenon of a highly concentrated current density is highly likely to occur when the current passes through the first curve portion 112. In the same way, the first thickening layer 210 may be arranged at the first curve portion 112, which may reduce the current density concentrated at the first curve portion 112.

Figure 11:
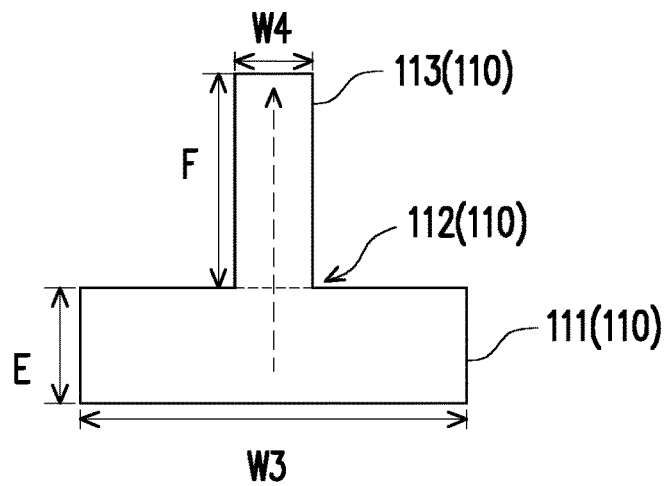
FIG. 11 is a partially planar schematic diagram of an electronic device package structure according to still another embodiment of the disclosure.

FIG. 11 is a partially planar schematic diagram of an electronic device package structure according to a further another embodiment of the disclosure. In the embodiment, the first curve portion 112 is a width-changing curve. The width W3 of the first conductive portion 111 and the width W4 of the second conductive portion 113 are different, and an extending direction E of the first conductive portion 111 and an extending direction F of the second conductive portion 113 are the same. When a current flows, for example, from the first conductive portion 111 of the first circuit layer 110 to the second conductive portion 113 (as the dotted arrow direction of FIG. 11), due to a large width change, a phenomenon of a highly concentrated current density is highly likely to occur when the current passes through the first curve portion 112. In the same way, a first thickening layer 210 may be arranged at the first curve portion 112, or the first thickening layer 210 may extend from the first curve portion 112 and be fully distributed on the second conductive portion 113, which may reduce a current density concentrated at the first curve portion 112.

Figure 12:
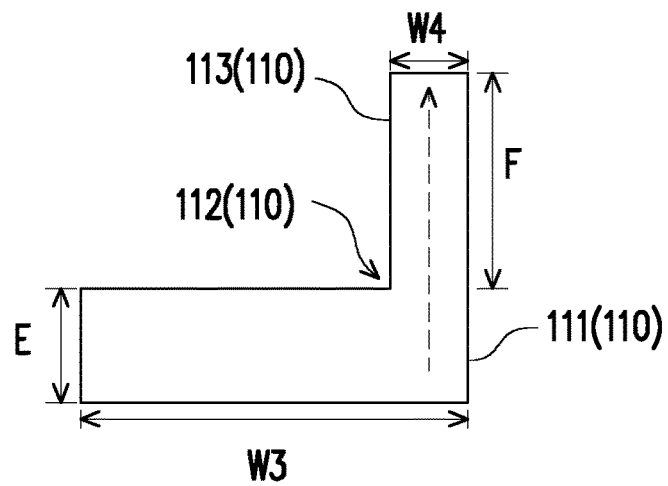
FIG. 12 is a partially planar schematic diagram of an electronic device package structure according to yet another embodiment of the disclosure.

FIG. 12 is a partially planar schematic diagram of an electronic device package structure according to a further another embodiment of the disclosure. The embodiment is similar to the embodiment of FIG. 11, and a difference is that the second conductive portion 113 is located on the side of the first conductive portion 111, and is of an L-shaped structure. When a current flows, for example, from the first conductive portion 111 of the first circuit layer 110 to the second conductive portion 113 (as the dotted arrow direction of FIG. 12), due to a large width change, a phenomenon of a highly concentrated current density is highly likely to occur when the current passes through the first curve portion 112. In the same way, a first thickening layer 210 may be arranged at the first curve portion 112, or the first thickening layer 210 may extend from the first curve portion 112 and be fully distributed on the second conductive portion 113, which may reduce a current density concentrated at the first curve portion 112. A curve form of the first curve portion may be an angle-changing corner, a width change, or a width-changing corner, which may be determined according to the design requirements.

In some embodiments, the electronic device 800 may be a power chip, such as an insulated-gate bipolar transistor (IGBT), a metal-oxide semiconductor field effect transistor (MOSFET) or a diode, and the disclosure is not limited thereto.

Based on the above, in the embodiments of the disclosure, the thickening layers are arranged at the curve portions, so that the current densities concentrated at the curve portions may be significantly reduced, and then the junction temperatures of the electronic devices adjacent to the curve portions are improved. The extending portions of the thickening layers contribute to shunting the currents concentrated at the curve portions to the respective conductive portions, which may shunt the currents concentrated at the curve portions and also significantly reduce the current densities, thereby reducing the junction temperatures of the electronic devices adjacent to the curve portions and increasing the heat dissipation efficiency of the electronic device package structure.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. An electronic device package structure, comprising:
   a substrate;
   a first circuit layer, arranged on the substrate, the first circuit layer having a first conductive portion, a second conductive portion and a first curve portion located between the first conductive portion and the second conductive portion, wherein at least a partial thickness of the first curve portion is greater than the thickness of the first conductive portion;
   a second circuit layer, arranged on the substrate; and
   an electronic device, arranged on the second circuit layer, wherein the electronic device is electrically connected to the second conductive portion of the first circuit layer.

2. The electronic device package structure according to claim 1, wherein a portion of the first curve portion having the thickness greater than that of the first conductive portion has a first thickening layer, and the width of the first thickening layer is gradually increased toward a direction away from the first conductive portion.

3. The electronic device package structure according to claim 2, wherein the first thickening layer extends from the first curve portion to the first conductive portion.

4. The electronic device package structure according to claim 2, wherein the first thickening layer extends from the first curve portion to the second conductive portion.

5. The electronic device package structure according to claim 1, wherein the first curve portion comprises a corner and/or is variable in width.

6. The electronic device package structure according to claim 1, wherein the second circuit layer comprises a third conductive portion, a fourth conductive portion and a second curve portion located between the third conductive portion and the fourth conductive portion, and the electronic device is arranged on the third conductive portion; and at least a partial thickness of the second curve portion is greater than the thickness of the third conductive portion.

7. The electronic device package structure according to claim 6, wherein a portion of the second curve portion having the thickness greater than that of the third conductive portion has a second thickening layer, and the width of the second thickening layer is gradually increased toward a direction away from the fourth conductive portion.

8. The electronic device package structure according to claim 6, wherein a portion of the second curve portion having the thickness greater than that of the third conductive portion has a second thickening layer, and the width of the second thickening layer is kept unchanged.

9. The electronic device package structure according to claim 8, wherein the second thickening layer extends from the second curve portion to the third conductive portion.

10. The electronic device package structure according to claim 8, wherein the second thickening layer extends from the second curve portion to the fourth conductive portion.

11. The electronic device package structure according to claim 1, further comprising:
    a third circuit layer, arranged between the first circuit layer and the second circuit layer, wherein the first circuit layer is electrically connected to the third circuit layer, and the third circuit layer is electrically connected to the electronic device.

12. The electronic device package structure according to claim 11, wherein the first circuit layer further comprises a fifth conductive portion and a third curve portion; the third curve portion is located between the second conductive portion and the fifth conductive portion; and at least a partial thickness of the third curve portion is greater than the thickness of the second conductive portion.

13. The electronic device package structure according to claim 12, wherein a portion of the third curve portion having the thickness greater than that of the second conductive portion has a third thickening layer, and the width of the third thickening layer is gradually increased along a negative Y-axis direction.

14. The electronic device package structure according to claim 13, wherein the third thickening layer extends from the third curve portion to the fifth conductive portion.

15. The electronic device package structure according to claim 13, wherein the third thickening layer extends from the third curve portion to the second conductive portion.

16. The electronic device package structure according to claim 12, wherein the third circuit layer further comprises a sixth conductive portion, a seventh conductive portion and a fourth curve portion located between the sixth conductive portion and the seventh conductive portion; and at least a partial thickness of the fourth curve portion is greater than the thickness of the sixth conductive portion.

17. The electronic device package structure according to claim 16, wherein a portion of the fourth curve portion having the thickness greater than that of the sixth conductive portion has a fourth thickening layer, and the width of the fourth thickening layer is gradually increased toward a direction away from the sixth conductive portion.

18. The electronic device package structure according to claim 17, wherein the fourth thickening layer extends from the fourth curve portion to the sixth conductive portion.

19. The electronic device package structure according to claim 17, wherein the fourth thickening layer extends from the fourth curve portion to the seventh conductive portion.

20. The electronic device package structure according to claim 1, wherein the electronic device comprises a power chip.

21. The electronic device package structure according to claim 1, wherein the substrate is a direct bonded copper (DBC) substrate or a direct plated copper (DPC) substrate.

22. The electronic device package structure according to claim 1, further comprising an input/output device, corresponding to the first conductive portion and arranged on the substrate, wherein the input/output device is electrically connected to the first conductive portion of the first circuit layer.

* * * * *